US006632097B2

(12) United States Patent
Chang

(10) Patent No.: US 6,632,097 B2
(45) Date of Patent: Oct. 14, 2003

(54) MEMORY CARD CONNECTION ARRANGEMENT

(76) Inventor: Chun-Jung Chang, 2F, No. 6, Lane 388, Sec. 1 Chieh-Shou Rd., Taipei Hsien (TW)

( * ) Notice: Subject to any disclaimer, the term of this patent is extended or adjusted under 35 U.S.C. 154(b) by 221 days.

(21) Appl. No.: 09/756,766

(22) Filed: Jan. 10, 2001

(65) Prior Publication Data

US 2002/0090845 A1 Jul. 11, 2002

(30) Foreign Application Priority Data

Aug. 9, 2000 (TW) ........................................ 89213833 U

(51) Int. Cl.⁷ ................................................ H01R 12/00
(52) U.S. Cl. ..................................... 439/76.1; 439/607
(58) Field of Search .............................. 439/76.1, 946, 439/607, 95; 361/737

(56) References Cited

U.S. PATENT DOCUMENTS

| | | | | |
|---|---|---|---|---|
| 5,505,628 A | * | 4/1996 | Ramey et al. | 439/76.1 |
| 5,780,365 A | * | 7/1998 | Nogami et al. | 439/76.1 |
| 6,018,461 A | * | 1/2000 | Biermann et al. | 361/737 |
| 6,071,149 A | * | 6/2000 | Hara | 439/607 |
| 6,132,223 A | * | 10/2000 | Seeley et al. | 439/76.1 |
| 6,142,793 A | * | 11/2000 | Schremmer et al. | 439/76.1 |
| 6,146,193 A | * | 11/2000 | Yu | 439/541.5 |
| 6,152,774 A | * | 11/2000 | Yu | 439/607 |
| 6,166,913 A | * | 12/2000 | Fun et al. | 361/737 |
| 6,181,564 B1 | * | 1/2001 | Furusho | 361/737 |
| 6,191,950 B1 | * | 2/2001 | Cox et al. | 361/737 |

* cited by examiner

*Primary Examiner*—P. Austin Bradley
*Assistant Examiner*—Edwin A. León
(74) *Attorney, Agent, or Firm*—Alan D. Kamrath; Rider Bennett, LLP

(57) ABSTRACT

The present invention relates to a memory card connection arrangement primarily including a top cover, a side frame and a bottom plate. The top cover contains a plurality of joint flanges and locking grooves, the side frame a plurality of joint holes at the position opposite to the joint flanges and the bottom plate a plurality of hooks at the position opposite to the locking grooves. In assembly, the joint flanges are engaged into the joint holes so that the top cover and the side frame are attached to each other while the hooks are hooked in the locking grooves so that the bottom plate and the side frame are connected to each other. Accordingly, a stable state in whole is achieved and the rims thereof are overlapped to avoid the electromagnetic interference.

5 Claims, 6 Drawing Sheets

MEMORY CARD CONNECTION ARRANGEMENT

BACKGROUND OF THE INVENTION

1. Field of the Invention

The present invention relates to a memory card connection arrangement, and more particularly, to a connection arrangement which includes a top cover with joint flanges and locking grooves, a side frame with joint holes for connection with the joint flanges of the top cover and a bottom plate with hooks for engaging into the locking grooves of the top cover. Accordingly, the whole housing of the memory card is formed by means that the metal components are overlapped in a tight connection for avoidance of the electromagnetic interference. Besides, it's easy in assembly and compact in connection.

2. Description of the Prior Art

The conventional memory card connection arrangement are generally achieved by hot melt adhesive, supersonic waves, laser welding or mechanic fastening. However, there are the following drawbacks in application of the aforementioned methods:

1. In using the hot melt adhesive, the processing duration is long, its cost is higher. Meanwhile, the finished products include clearance, thereby causing electromagnetic interference. In addition, it's easily bent in heating.

2. In using the supersonic waves, it's easily damaged in processing. Moreover, the finished products includes clearance, thereby causing electromagnetic interference.

3. In using the laser welding, the processing duration is long, its cost is higher. Meanwhile, the equipment is very expensive.

4. In using the mechanic fastening, as shown in FIG. 1, one side of a top cover 100 is extended with a hooking element 1001 for hooking on a flange 2001 of a side frame 200. The bending member 3001 at side end of a bottom plate 300 is engaged into a receiving groove 2002 at bottom of side frame 200. Accordingly, the components are connected as a whole. It's convenient in processing and the cost is therefore reduced. However, it is easily loosened because of bad connection strength.

SUMMARY OF THE INVENTION

It is a primary object of the present invention to remove the aforementioned drawbacks and to provide a memory card connection arrangement in which a top cover is provided with a plurality of joint flanges for engaging into joint holes of a side frame, and a plurality of locking grooves for receiving hooks of a bottom plate. In assembly, it's only required to align each component for a tight, stable, convenient and easy connection.

It is another object of the present invention to provide a memory card connection arrangement in which the top cover and the bottom plate are connected in overlapped manner so that the whole rims thereof are effectively isolated and completely covered for avoidance of the electromagnetic interference.

BRIEF DESCRIPTION OF THE DRAWINGS

The drawings disclose illustrative an embodiment of the present invention which serves to exemplify the various advantages and objects hereof, and are as follows:

FIG. 5A is a cutaway view of the connection of the top cover and a bottom plate of the present invention.

DETAILED DESCRIPTION OF THE PREFERRED EMBODIMENT

Figure 1:
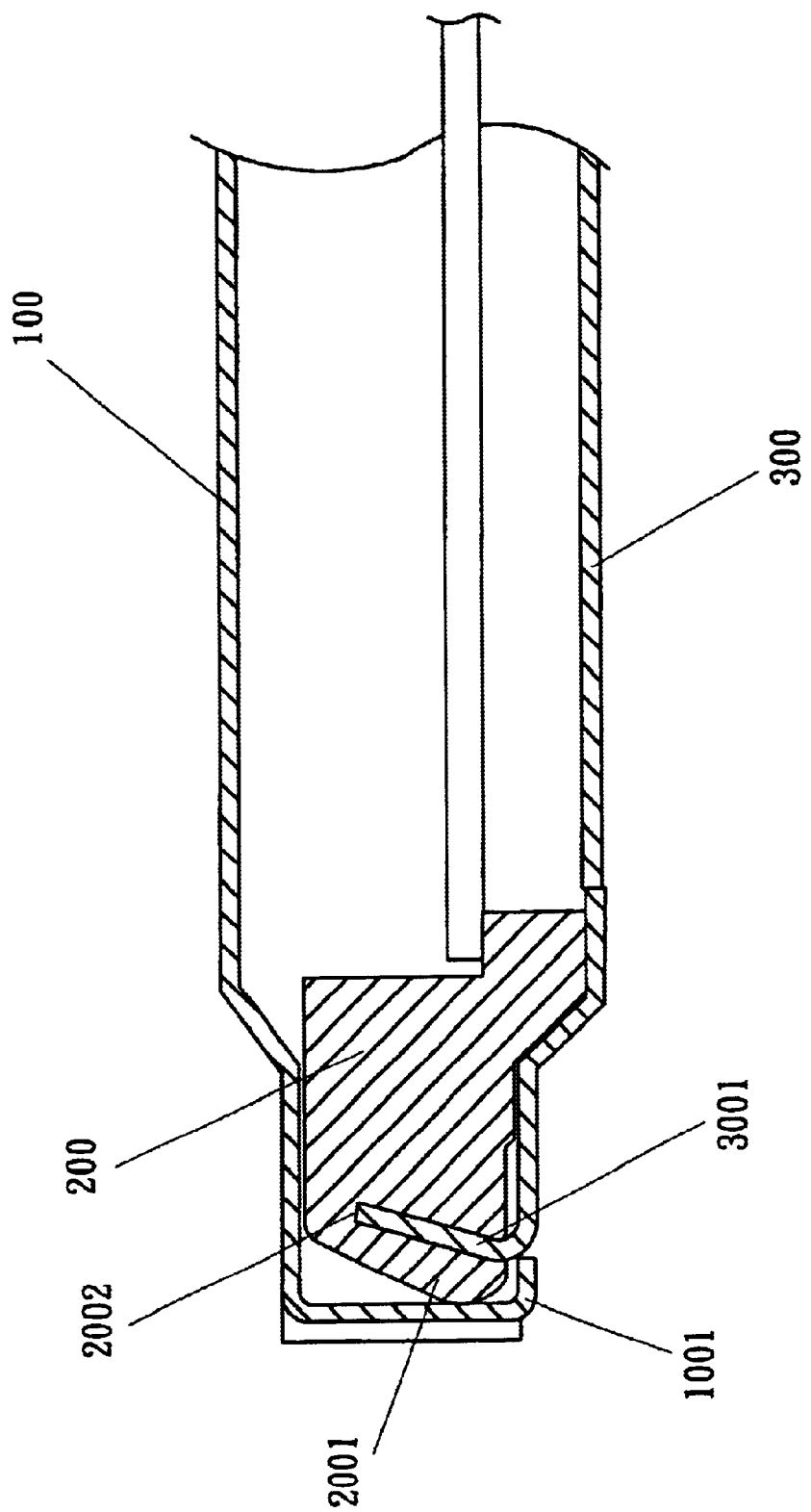
FIG. 1 is a sectional view of a conventional memory card connection arrangement.

FIG. 1 shows sectional view of a conventional memory card connection arrangement. The configuration and the disadvantage thereof have been shown above and won't be described more hereinafter.

Figure 2:
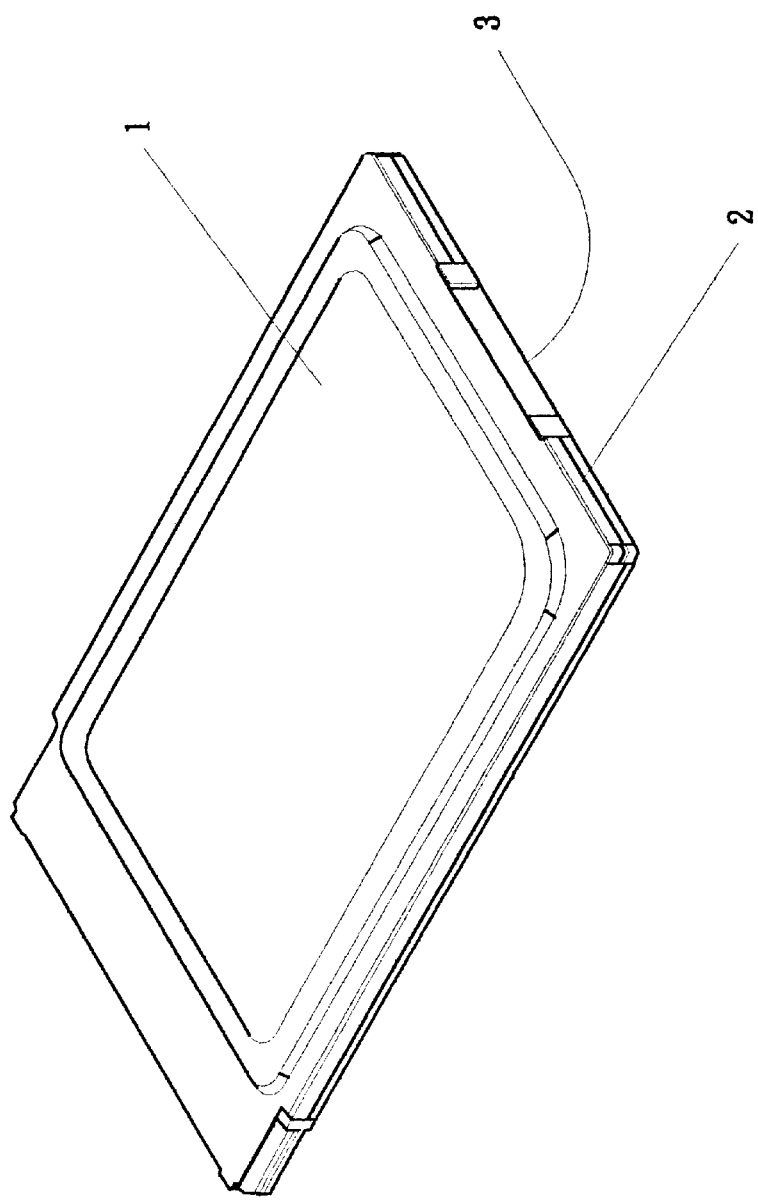
FIG. 2 is a perspective assembly view of a preferred embodiment of the present invention.
Figure 3:
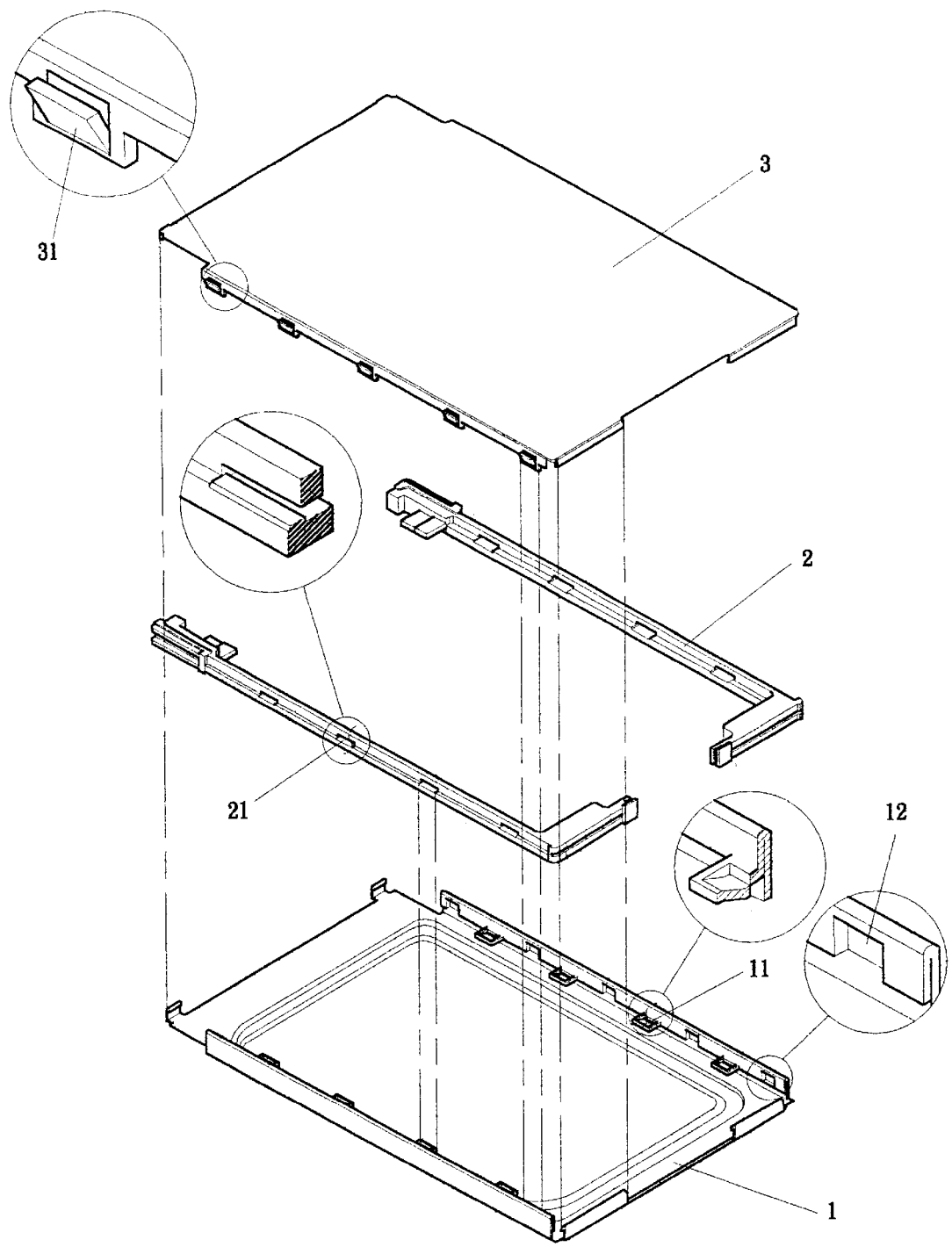
FIG. 3 is a perspective exploded view of the preferred embodiment of the present invention.

Referring to FIGS. 2 and 3, the memory card connection arrangement in accordance with the present invention at least includes a top cover 1, a side frame 2 and a bottom plate 3. The top cover 1 is provided with a plurality of joint flanges 11 and locking grooves 12. The side frame 2 includes a plurality of joint holes 21 at the position opposite to the joint flanges 11. The bottom plate 3 includes a plurality of hooks 31 at the position opposite to the locking grooves 12. In assembly, the side frame 2 is engaged from the middle part of the top cover 1 to the side thereof in such a way that the joint flanges 11 are locked in the joint holes 21 while the hooking rim 111 of the joint flange 11 leans against the rim 211 of the joint hole 21 (see FIG. 5) for a tight connection. Thereafter, the folding side of the bottom plate 3 is engaged from the guide opening formed at an incline 22 of the bottom of the bottom plate 3 into a clearance formed between the top cover 1 and the side frame 2 after attachment thereof in such a way that the hooks 31 of the bottom plate 3 are hooked in the locking grooves 12 of the top cover 1 while hooking rims 311 lean against the respective rims of the locking grooves 12 (see FIG. 5A). Accordingly, a convenient, fast, effective and stable assembly is achieved.

Figure 4:
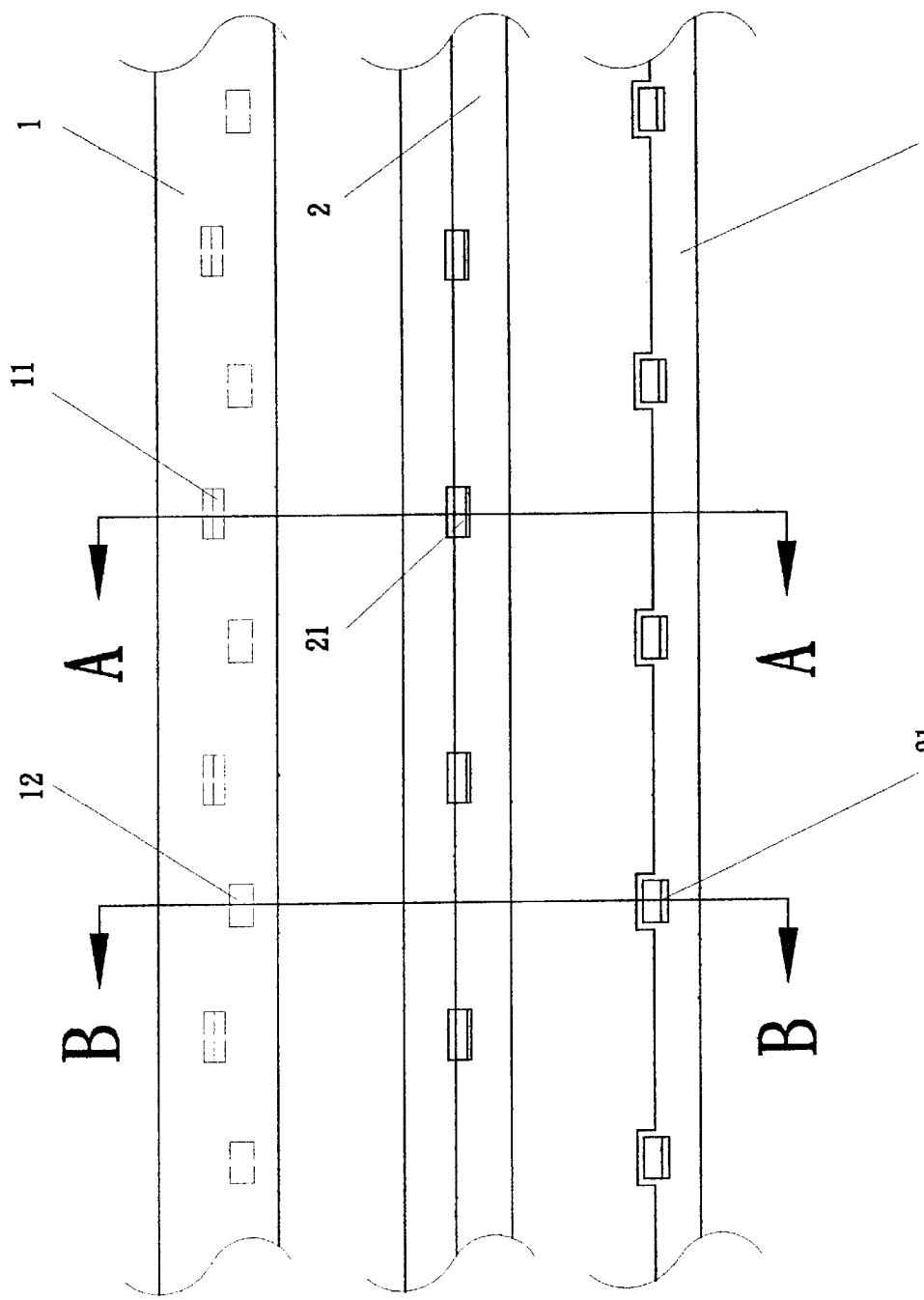
FIG. 4 is a front view of the preferred embodiment of the present invention.
Figure 5:
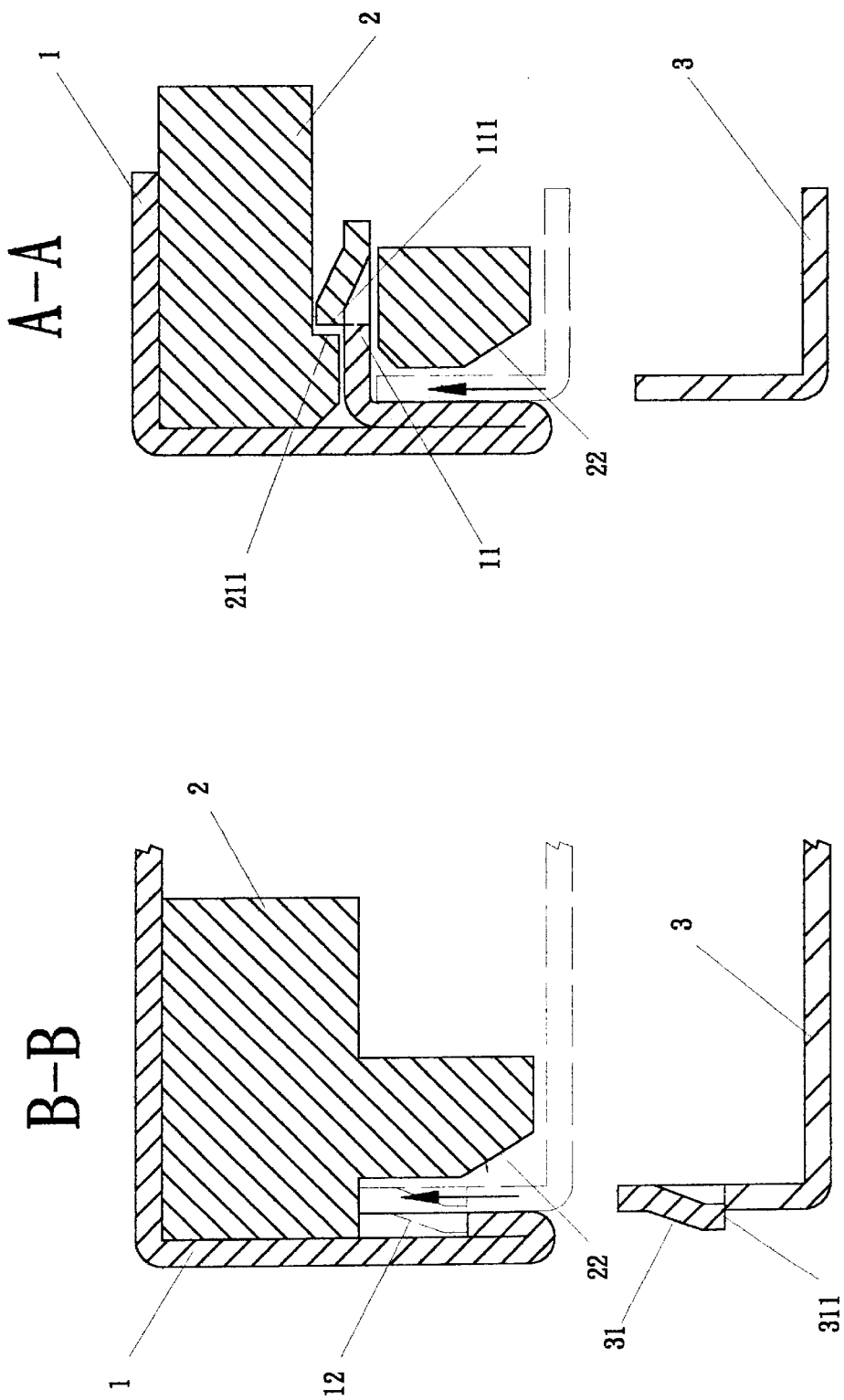
FIG. 5 is a cutaway view of the connection of a top cover and a side frame of the present invention.

FIG. 4 shows a front view of the preferred embodiment of the present invention. Meanwhile, referring to FIG. 5, it shows a section taken along A—A of FIG. 4, and FIG. 5A shows a section taken along B—B of FIG. 4. From these three drawings, the relative position of each member is apparent. The hooking rim 111 of the joint flange 11 and the hooking rim 311 of the 31 are formed by means that the top cover 1 and the bottom plate 3 are penetratingly processed in such a way that one part thereof protrudes in one side to be an inverted hook. The top cover 1 and the bottom plate 3 at the rim of the assembled memory card are overlapped with each other. Accordingly, an effective package is formed to exactly avoid the electromagnetic interference (EMI).

Figure 6:
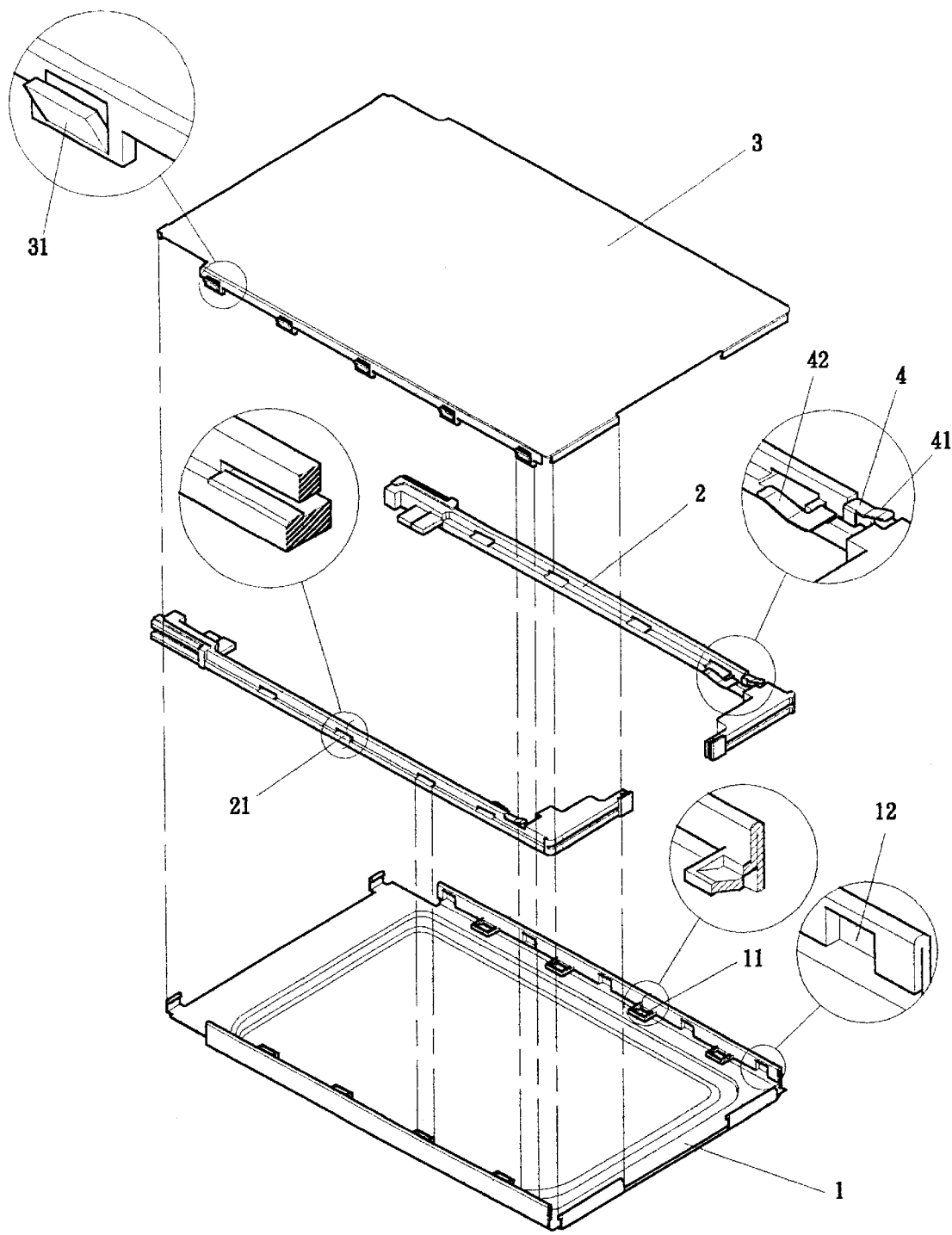
FIG. 6 is a perspective assembly view of another preferred embodiment of the present invention.

Referring to FIG. 6, two sides of the side frame 2 are respectively fitted with a conductive piece 4 which includes two contact pieces 41, 42 one of which is in contact with the metal of the top cover 1 while the other one is disposed inside the memory card to be in contact with the circuit board thereof. Accordingly, a circuit is produced and the top cover 1 serves as a shelter for decreasing the electromagnetic interference (EMI). The contact piece 41 is respectively disposed at the right and left side of the side frame 2, extends from middle fixing member thereof and is formed in a butterfly shape.

Many changes and modifications in the above-described embodiments of the invention can, of course, be carried out without departing from the scope thereof. Accordingly, to promote the progress in science and the useful arts, the invention is disclosed and is intended to be limited only by the scope of the appended claims.

What is claimed is:

1. A memory card connection arrangement comprising:

a top cover having a plurality of joint flanges and locking grooves;

a side frame having a plurality of joint holes at the position opposite to said joint flanges;

a bottom plate having a plurality of hooks at the position opposite to said locking grooves;

wherein, in assembly, said joint flanges are engaged into said joint holes so that said top cover and said side frame are attached to each other while said hooks are hooked in the locking grooves so that said bottom plate and said top cover are connected to each other; whereby, a stable state in the arrangement is achieved and rims of the top cover and bottom plate are overlapped to avoid electromagnetic interference, wherein said top cover is a metal plate and two sides of said side frame are respectively fitted with a conductive piece which includes two contact portions, one said contact portion being in contact with the metal plate of said top cover while the other said contact portion being disposed inside a memory card to be in contact with a circuit board thereof to form a ground circuit between said circuit board and said top cover, and wherein said contact portions are disposed at sides of the respective side frames, said contact portions extending from a middle fixing member thereof to form a butterfly shape.

2. A memory card connection arrangement as claimed in claim 1, wherein said top cover is a metal plate, wherein said joint flanges comprises a folded part at said rim of said top cover and an end that protrudes to form an inverted hook.

3. A memory card connection arrangement as claimed in claim 1, wherein said locking grooves of said top cover are formed in the rim of said top cover.

4. A memory card connection arrangement as claimed in claim 1, wherein said side frame is disposed at an inner side of a bent part of said top cover while said joint holes thereof are formed in a rectangular shape and correspond to said joint flanges of said top cover in such a way that said side frame is stably attached to said top cover.

5. A memory card connection arrangement as claimed in claim 1:

wherein a clearance is formed after attachment of said top cover and said side frame, and wherein a deeper clearance is formed at said locking grooves of said top cover, and an incline is disposed at the inner side of said clearance and at a bottom of said side frame so that said bottom plate is easily guided and engaged in assembly, and wherein said rim of said bottom plate and said hooks of said bottom plate are received in said clearance so that said top cover and said bottom plate are stably overlapped.

\* \* \* \* \*